United States Patent [19]

Losee et al.

[11] Patent Number: 5,051,832

[45] Date of Patent: Sep. 24, 1991

[54] SELECTIVE OPERATION IN INTERLACED AND NON-INTERLACED MODES OF INTERLINE TRANSFER CCD IMAGE SENSING DEVICE

[75] Inventors: David L. Losee, Fairport; Bruce C. Burkey, Rochester; Teh-Hsuang Lee, Webster, all of N.Y.

[73] Assignee: Eastman Kodak Company, Rochester, N.Y.

[21] Appl. No.: 478,857

[22] Filed: Feb. 12, 1990

[51] Int. Cl.$^5$ .................. H04N 3/14; H04N 5/335; H01L 29/78
[52] U.S. Cl. .................. 358/213.29; 358/213.26; 358/213.31; 357/24 LR
[58] Field of Search .................. 358/213.31, 213.29, 358/213.26, 213.22, 213.23, 213.24, 213.25, 213.18, 213.28, 213.19, 140; 357/24 LR, 30 H, 30 I; 377/61-63, 60

[56] References Cited

U.S. PATENT DOCUMENTS

| | | | |
|---|---|---|---|
| 4,330,796 | 5/1982 | Anagnostopoulos et al. | 358/213 |
| 4,580,169 | 4/1986 | Savoye | 358/213.31 |
| 4,613,402 | 9/1986 | Losee et al. | 156/643 |
| 4,740,828 | 4/1988 | Kinoshita | 358/48 |
| 4,803,706 | 2/1989 | Murayama et al. | 377/63 |
| 4,816,916 | 3/1989 | Akiyama | 358/213.29 |
| 4,849,814 | 7/1989 | Van De Steeg | 358/213.31 |
| 4,866,528 | 9/1989 | Yamazaki et al. | 358/213.22 |
| 4,908,518 | 3/1990 | Losee et al. | 358/213.23 |

FOREIGN PATENT DOCUMENTS 0174583 9/1985 Japan ...................... 358/213.22

Primary Examiner—Tommy P. Chin
Assistant Examiner—Safet Metjahic
Attorney, Agent, or Firm—Raymond L. Owens

[57] ABSTRACT

An interline transfer type area image sensor is described which can selectively operate in either an interlaced or non-interlaced read-out mode. The sensor includes a plurality of vertical CCD shift registers. Each shift register has an ion implanted shift transfer barrier or storage regions such that only one layer of gate electrode is required by each voltage clock, and a structure for selectively applying voltages to the clock lines for alternate rows of one or both of the vertical shift register electrodes.

1 Claim, 5 Drawing Sheets

SELECTIVE OPERATION IN INTERLACED AND NON-INTERLACED MODES OF INTERLINE TRANSFER CCD IMAGE SENSING DEVICE

FIELD OF THE INVENTION

This invention relates to image sensing devices and, more particularly, to interline transfer type imager sensor which can be operated with both interlaced and non-interlaced read-out modes.

BACKGROUND OF THE INVENTION

In interline transfer type imaging devices, photogenerated charge is colllected on a pixel or photoreceptor element such as a pn junction (photodiode) or under the gate of the photocapacitor, for a period of time and then transferred into a charge coupled register to be detected by an output circuit. In an area array of such pixels it is necessary to transfer the collected photocharge, first into a vertical shift register and then to a horizontal shift register, finally, reaching a charge sensitive detector or amplifier. Prior art interline transfer type devices have largely been arranged to be read out in what has been termed the interlaced mode of operation. In a typical prior art device shown schematically in FIGS. 1 and 2, alternate rows of photoreceptors are read out in sequence, odd numbered rows being associated with one, so called, field, and even numbered rows associated with a second field. FIG. 2 is a schematic vertical section taken along the line A—A of FIG 1. Referring now to FIGS. 1 and 2, a given field of pixels, rows 1, 3, 5, etc., is addressed by application of a voltage to electrodes 20 and 30 which are both conneted to the same vertical clock line, $\phi_1$. Upon application of this voltage, photocharge is transferred, as indicated schematically by the horizontal arrows in FIG. 1 to the buried channel 40 of the vertical shift register (see FIG. 2). This vertical shift register is composed of buried channel 40, electrodes 20 and 30 which are connected to vertical clock line $\phi_1$, and electrodes 50 and 60 are connected to vertical clock line $\phi_2$. These electrodes are separated from the substrate semiconductor 70 by an insulating layer 80. The regions 65 beneath electrodes 30 and 60 are ion implanted to provide a potential energy difference between regions 25 and 26, controlled by voltages on the $\phi_1$ clock line, and between regions 55 and 56, controlled by voltages on the $\phi_2$ clock line. To read-out image information on, say, odd numbered rows of pixels, line $\phi_1$ is pulsed in a manner to effect transfer of the photocharge from the photodiodes to the buried channel region under electrode 20. This odd-field transfer pulse is indicated in FIG. 3a. The photocharge is then transferred via the vertical and horizontal CCD shift registers to a charge detection amplifier. Subsequently, sites on even numbered rows are read out as a second field in a similar manner by application of an even-field transfer pulse, indicated schematically in FIG. 3a, thus transferring photocharge from even numbered rows of pixels to the buried channel region beneath electrodes 50. Subsequent clocking transfers the photocharge to the output amplifier via the vertical and horizontal shift registers. The vertical clocking voltages for this interlaced type of operation are indicated schematically in FIG. 3a. However, with such a prior art device architecture it is not possible to read-out each row of pixels sequentially, i.e., in what would be called a non-interlaced mode, since only one half of a vertical shift register cell is provided for each row of pixels. For a non-interlaced read-out to be achieved a complete vertical CCD shift register cell is required for each row of photodiodes since photocharge from all pixels must be transferred into the vertical shift register simultaneously and maintained as separate charge packets throughout transfer to the output amplifier. In order to provide for such a non-interlaced read-out sequence using such prior art, each pixel would need to contain at least four separate CCD electrodes if a similar manufacturing process is to be used and the same number of clocking voltages maintained. Alternatively, if three levels of overlapping electrodes are employed with a three-phase clocking sequence, such as disclosed by Tsaur et al in IEEE Electron Device Letters, 10, 361–363, 1989, a non-interlaced read-out may be achieved but at the expense of additional process and system complexity and a sacrifice of available photosensitive area but without the option of achieving an interlaced readout with the same device.

In U.S. Pat. No. 4,330,796, Anognostopoulos et al disclose a non-interlaced interline transfer type CCD image sensor which employs three electrodes per pixel and a "meander channel" CCD which occupies a large fraction of the total pixel area. However, as discussed in Loose et al, U.S. Pat. No. 4,613,402, if the barrier region implants in the meander channel CCD are not precisely aligned, parasitic potential wells or barriers will be present in the CCD, thus leading to transfer inefficiency and poor performance. Furthermore, the device of Anognostopoulos et al does not allow selection of either interlaced or non-interlaced read-out.

SUMMARY OF THE INVENTION

It is the object of this invention to provide an image sensor with simplified pixel design which may be operated in both an interlaced and a non-interlaced mode.

This object is achieved by providing a plurality of vertical CCD shift registers, with each shift register having ion implanted transfer barrier or storage regions such that only one layer of gate electrode is required by each voltage clock line and means for selectively providing separate clocking voltages to the voltage clock lines for alternate rows of one or both of the vertical shift register electrodes.

The present invention employs a two-phase CCD shift register which utilizes only one electrode for each clock phase, a first level electrode and a second level electrode, thus realizing a simplified non-interlaced read-out type device with a correspondingly improved ratio of photosensitive area to total pixel area. The design thus requires only two electrodes to be associated with a given row of pixels, these two electrodes comprising one complete CCD stage, for each row of imaging sites. Alternate pairs of one or both levels of electrodes are connected to separate clocking voltages thus allowing the optional selection of either interlaced or non-interlaced read-out. The self-alignment of the transfer barrier region or storage region implants assure excellent transfer efficiency in the CCD shift register.

BRIEF DESCRIPTION OF THE DRAWINGS

FIG. 3b through FIG. 3c are schematic clock timing diagrams for operation of the device of the present invention in non-interlaced and interlaced modes, respectively;

DETAILED DESCRIPTION OF THE INVENTION

Figure 4:
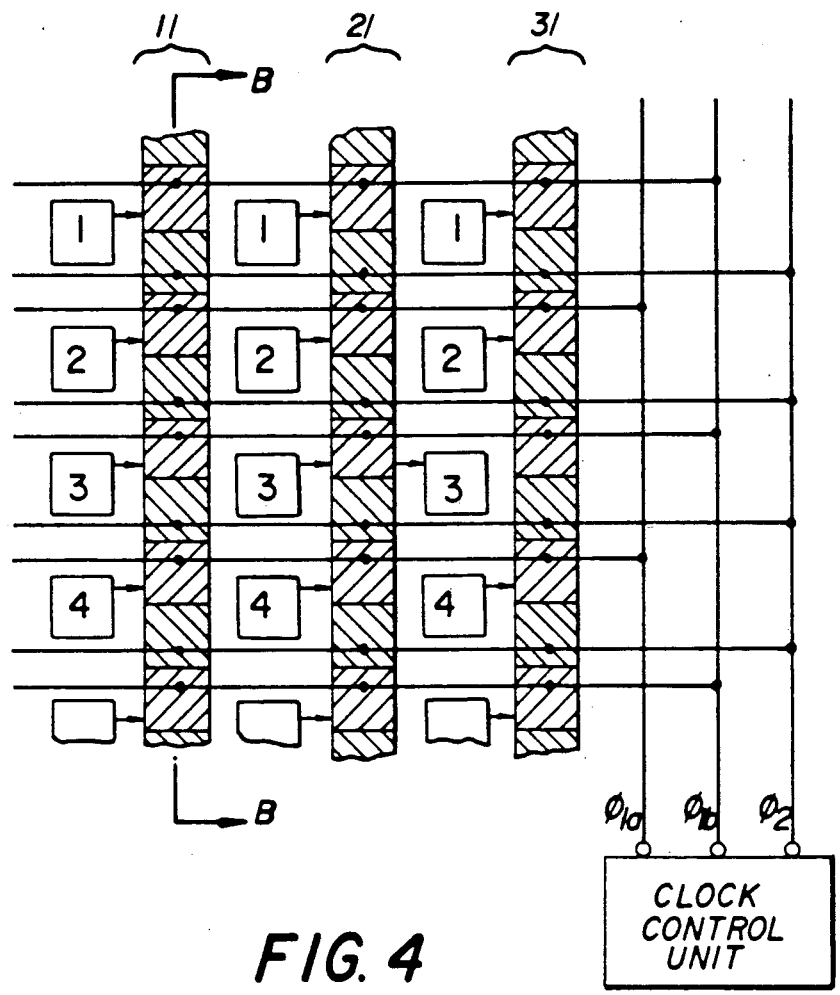
FIG. 4 is a schematic plan view of one embodiment of a portion of the present invention.

FIG. 4 schematically represents a plan view of a portion of an interline transfer device in one embodiment of the present invention. Rows of pixels or photoreceptor elements, such as those labeled 1, 2, 3, and 4 are interposed with vertical shift register columns 11, 21, 31, etc. It is understood, but not shown, that a transfer arrangement is provided to permit transfer of photogenerated charge from the pixels to the corresponding vertical shift register elements. Such a transfer of charge is indicated schematically by the horizontal arrows shown in FIG. 4. The vertical shift register is a two-phase CCD shift register composed of two overlapping conductor layers, typically consisting of doped polysilicon. The two phase sections of the shift register are indicated in FIG. 4 by the areas crosshatched with left down-sloping and right down-sloping lines, respectively. A clock voltage control unit is shown in FIG. 4 which applies appropriate voltages to the vertical shift register electrodes. Such clock signal producing structures are well-known in the art. See, for example, commonly assigned U.S. Pat. No. 4,922,137 filed Jun. 6, 1989 in the name of Small et al, the disclosure of which is incorporated by reference herein. As indicated in FIG. 4 is interconnection of the clock voltage line $\phi_{1a}$ to first level electrodes associated with photoreceptors on odd number rows such as 1 and 3, interconnection of clock voltage line $\phi_{1b}$ to first level electrodes associated with photoreceptors on even numbered rows such as 2 and 4, and interconnection of clock voltage line $\phi_2$ to second level electrodes. More detail of the vertical shift register is provided in FIG. 5 where a schematic vertical section taken along the line B—B of FIG. 4 is shown.

Figure 5:
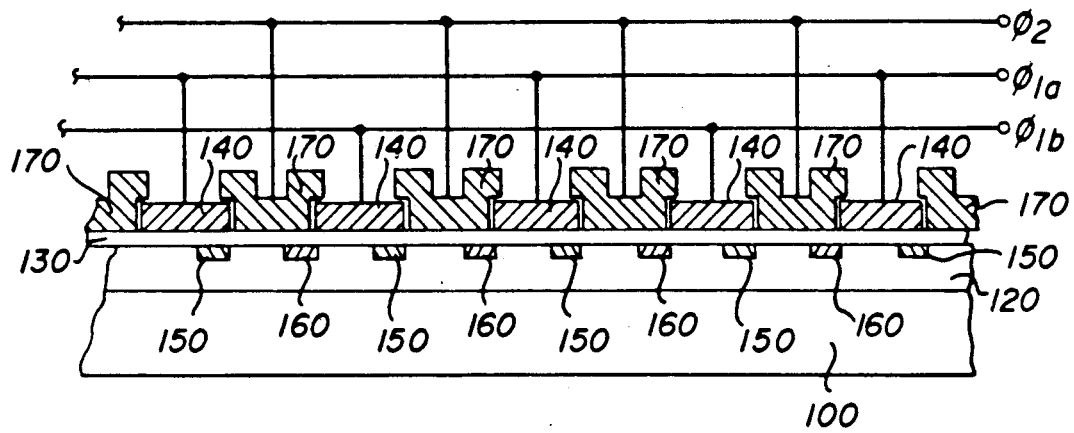
FIG. 5 is a fragmentary, partially schematic cross-section taken along section B—B of FIG. 4.

With reference to FIG. 5, a p-type semiconductor substrate 100 is provided with an n-type buried channel region 120. An insulating oxide 130 is grown over the substrate and first level polysilicon electrodes 140 are provided. Doped regions 150 are produced in the substrate by means such as disclosed by Losee et al, U.S. Pat. No. 4,613,402, said doped regions being positioned under electrodes and accurately aligned with respect to the edges of first level polysilicon electrodes 140. Additional doped regions 160 are provided adjacent to electrodes 140 and second level polysilicon electrodes 170 are formed. Electrodes 170 are connected to clock voltage line $\phi_2$ and alternate electrodes of first level polysilicon are connected to line $\phi_{1a}$ land $\phi_{1b}$ respectively. The doping in regions 150 and 160 is such that a potential energy step is formed in the buried channel beneath each electrode thus facilitating charge transfer.

Figure 1:
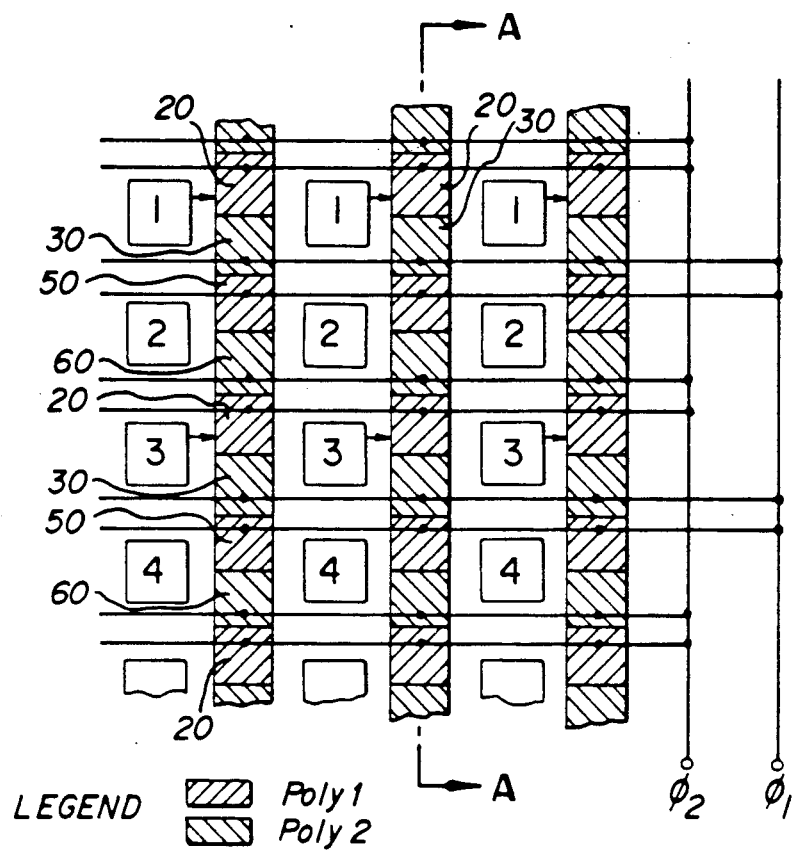
FIG. 1 is a schematic plan view of a portion of a typical prior art interlaced read-out type imaging device.
Figure 2:
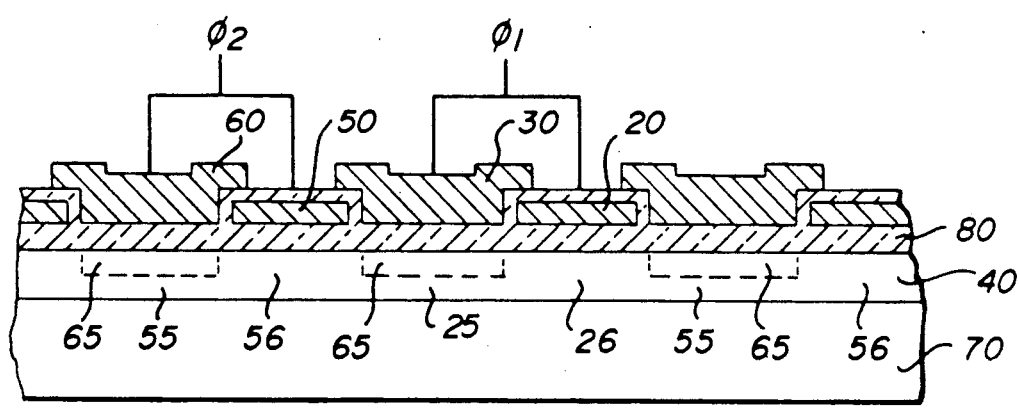
FIG. 2 is a fragmentary, partially schematic vertical section view through a semiconductor device, taken along the lines A—A of FIG. 1, illustrating a prior art construction.
Figure 3A:
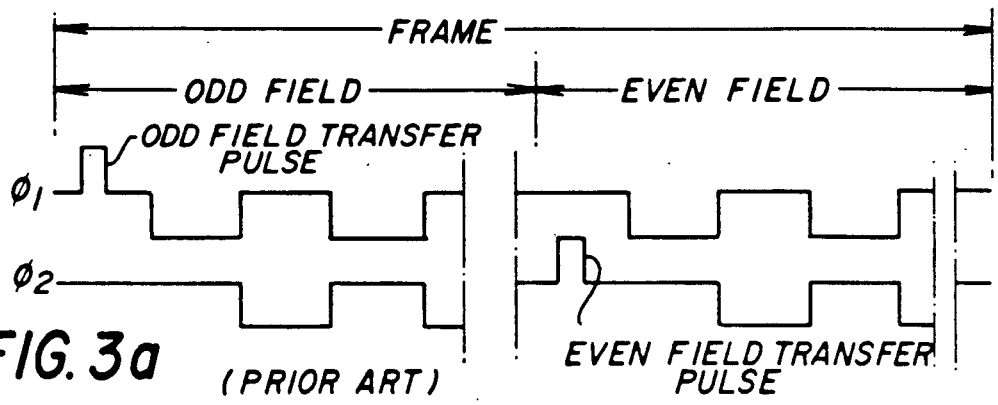
Figure 3B:
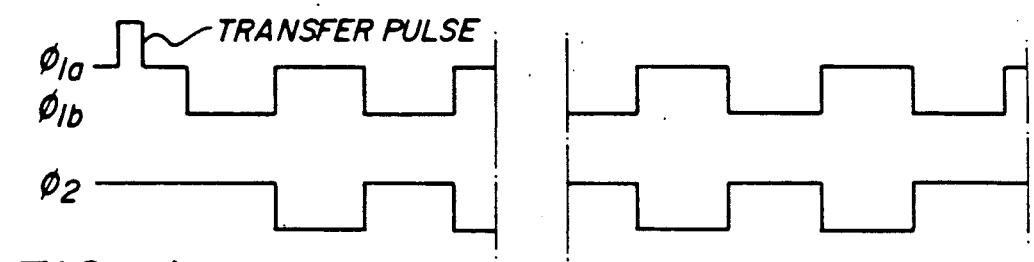
FIG. 3b is a schematic clock timing diagram for operation of a prior art interlaced field type device.

Clocking voltages for operation of the device in a non-interlaced mode are shown in FIG. 3b. Referring now to FIG. 3b and the embodiment shown in FIG. 4, clock voltages applied to line $\phi_{1a}$ are identical to those applied to line $\phi_{1b}$. At the beginning of a frame, a transfer pulse, shown schematically in FIG. 3b, is applied as indicated, at which time photocharge is transferred from all photoreceptor sites into corresponding positions in the vertical shift register channels. Then two phase clocking transfers the charges, one row at a time, to a horizontal shift register in a well-known manner.

Figure 3C:
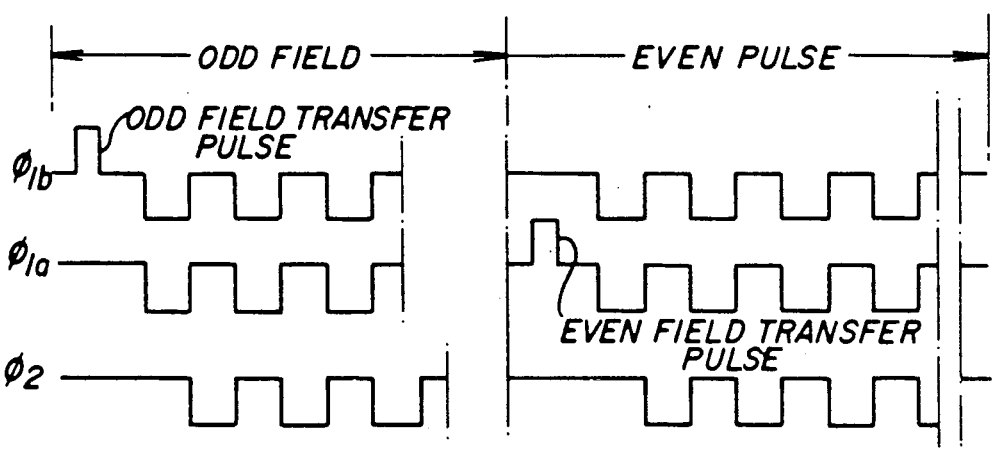

Interlaced read-out operation of the device is provided by clock voltages as indicated in FIG. 3c where photocharge from odd numbered rows of photoreceptors is transferred with the odd-field transfer pulse indicated for line $\phi_{1a}$ and read out, then photocharge from even numbered rows is transferred with a similar even-field pulse applied to line $\phi_{1b}$ and read out. Note that the vertical clocking pulses must run at twice the rate as for the non-interlaced case if the full frame of image information is to be read out is the same frame time. This is because, in the interlaced mode, each row must be transferred over two complete CCD stages in order to advance the next odd (or even) numbered row into the horizontal CCD.

Figure 6:
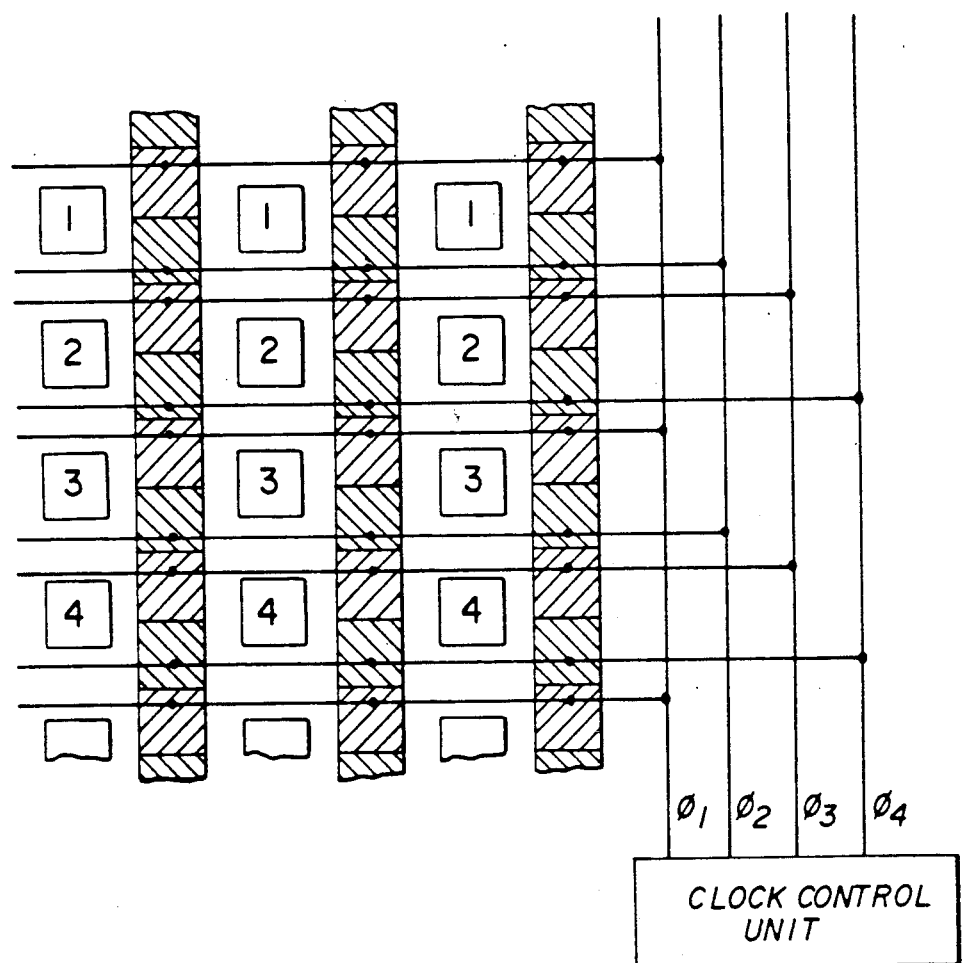
FIG. 6 is a plan view of an alternative embodiment of the present invention.
Figure 7:
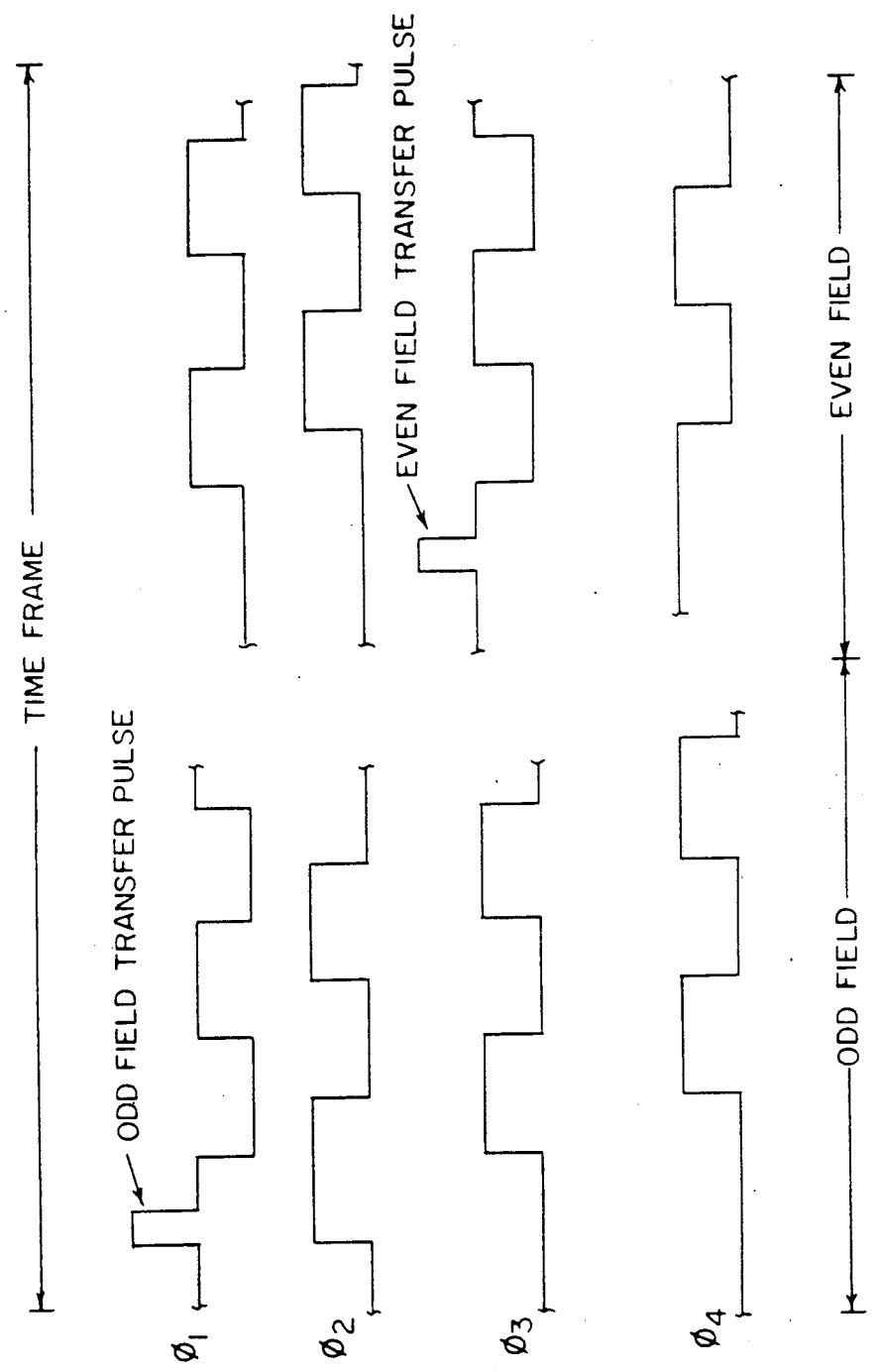
FIG. 7 is a schematic clock timing diagram to allow operation of the device of FIG. 6 in an interlaced read-out mode.

A second embodiment of this invention is shown schematically in FIG. 6. A clock voltage control unit for applications of appropriate clock voltages is also indicated in FIG. 6. In this embodiment provision is made for alternate rows of both first level and second level electrodes to be connected to separate voltage clocks. In order to operate the device in a non-interlaced mode, electrodes formed from the first level of polysilicon, line $\phi_1$, and line $\phi_3$, are connected to a first phase clock voltage and electrodes formed from the second level of polysilicon, line $\phi_2$ and line $\phi_4$, are connected to a second phase clock and clocking proceeds as indicated schematically in FIG. 3b and already described for the first embodiment given above. For interlaced operation, clocking similar to that indicated schematically in FIG. 7 may be employed. An odd-field transfer pulse applied by clock line $\phi_1$ transfers charge from odd numbered rows of photoreceptors. Subsequently, clock voltages on lines $\phi_1$, $\phi_2$, $\phi_3$, and $\phi_4$ with pulses arranged to complete transfer of charge through two adjacent pixels for each clock cycle, transfer photocharge to the horizontal shift register for read-out. This embodiment has the advantage that the vertical clock frequency remains the same for both the interlaced and non-interlaced operation.

It will be understood that the conductive electrodes 140 and 170 can either or both be composed of composite layers of polysilicon covered with a metal silicide of the group consisting of $WSi_x$, $MoSi_x$, $TaSi_x$, $TiSi_x$, W, Mo, or Ta.

It is to be understood that although the description and illustrations for this invention have been given for an n-channel device, the invention applies equally for p-channel devices with appropriate channels in doping types as is well known to those skilled in the art.

Technical Advantages

Standard systems for sensing and display of video images operate with a, so-called, interlaced format for the read-out and display of image information. In this interlaced read-out sequence alternate rows of picture elements, or pixels, providing one field are read out, one row at a time Then, a second field, consisting of the remaining alternate rows of pixels, is read out. This read-out sequence is then repeated at, typically, a rate of 25 to 30 times per second. Increasingly, Charge Coupled Device (CCD) images sensors are the preferred device for the image sensing in video systems. The pixel architecture of CCD sensors for these applications is frequently of the interline transfer type. For applications in electronic photography, however, CCD image sensors of the interline transfer type but with non-interlaced read-out sequence may be required. Such devices read out each row of pixels in sequence rather than by alternate rows.

In accordance with this invention, a non-interlaced interline transfer CCD imaging device with simplified structure, and, hence improved manufacturability is disclosed. The clocking and electrode wiring is such that the device may be operated in either interlaced or non-interlaced mode. The device utilizes ion implanted barrier or storage regions, which may be self-aligned such as described by Losee et al U.S. Pat. No. 4,613,402, to produce a device with the minimum number of two polysilicon electrodes associated wiht each pixel. The structural simplifications maximize the photosensitive area, thus improving the photographic performance and the choice of either interlaced or non-interlaced read-out provides enhanced system flexibility for both video and electronic still photography applications.

The invention has been described in detail with particular reference to a certain preferred embodiment thereof, but it will be understood that variations and modifications can be effected within the spirit and scope of the invention.

What is claimed is:

1. In an interline transfer type area image sensor having rows and columns of spaced pixels and which can selectively be operated in either an interlaced or a non-interlaced read-out mode, the improvement comprising voltage clocks, a plurality of vertical two-phase CCD shift registers, with each shift register having ion implanted transfer barrier or storage regions such that only one layer of gate electrodes is required by each voltage clock line, and means for selectively applying voltages to the clock lines for either alternate rows of the vertical shift register electrodes for interlace mode of all of the rows of the vertical shift register electrodes for non-interlace mode.

* * * * *